United States Patent [19]

Moyer

[11] 4,230,740
[45] Oct. 28, 1980

[54] HEAT STABLE, NON-YELLOWING PHOTOPOLYMER COMPOSITIONS

[75] Inventor: Joseph D. Moyer, Silver Spring, Md.

[73] Assignee: W. R. Grace & Co., New York, N.Y.

[21] Appl. No.: 32,627

[22] Filed: Apr. 23, 1979

Related U.S. Application Data

[63] Continuation-in-part of Ser. No. 882,021, Feb. 28, 1978, abandoned.

[51] Int. Cl.³ ............................ B05D 3/06; C08F 8/18
[52] U.S. Cl. ........................... 427/54.1; 204/159.14; 204/159.18; 427/44; 427/53.1
[58] Field of Search ........ 427/44, 54, 54.1, 53.1; 204/159.14, 159.18, 159.19; 260/850, 856

[56] References Cited

U.S. PATENT DOCUMENTS

| | | | |
|---|---|---|---|
| 3,020,255 | 2/1962 | Magrane et al. | 260/850 X |
| 3,499,849 | 3/1970 | Sekmakas et al. | 260/67.6 R X |
| 3,847,767 | 11/1974 | Kloczewski | 204/159.14 |

Primary Examiner—Ronald H. Smith
Assistant Examiner—Thurman K. Page
Attorney, Agent, or Firm—Richard P. Plunkett; William W. McDowell, Jr.

[57] ABSTRACT

This invention relates to heat stable, non-yellowing photopolymer compositions comprising a polythiol, a photoinitiator and a polyene of the formula:

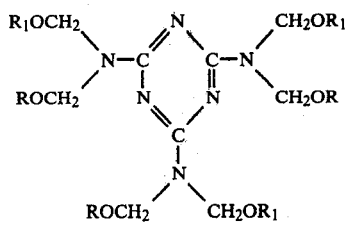

wherein R are all the same member of the group consisting of

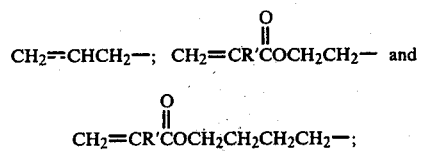

$R_1$ is $-CH_3$ or R, and R' is $-CH_3$ or H.

The UV cured coating resulting from this composition are non-yellowing even after baking for 15 minutes at 450° F.

2 Claims, No Drawings

HEAT STABLE, NON-YELLOWING PHOTOPOLYMER COMPOSITIONS

This application is a continuation-in-part of my co-pending application having Ser. No. 882,021, filed Feb. 28, 1978, now abandoned.

This invention relates to photopolymer compositions. More particularly, it relates to heat stable, non-yellowing photopolymer compositions.

It is known that polyenes are curable by polythiols in the presence of free radical generators such as actinic radiation to solid polythioether-containing resinous or elastomeric products. See U.S. Pat. No. 3,661,744 and U.S. Pat. No. 4,008,341. For the most part, however, these commercially available polyenes and polythiols used in curing leave something to be desired as far as heat stability is concerned. This shortcoming was somewhat overcome by the introduction of heat stable polyenes derived from hydantoin acids, amines and esters as set out in U.S. Pat. No. 4,084,020 and two other polyenes set out in U.S. Pat. No. 3,847,767, both assigned to the same assignee. However, although these materials have good heat stability, their ability to withstand discoloration after being heated at high temperatures is negligible.

One object of the instant invention is to provide a photocurable polyene-polythiol composition which is substantially non-yellowing after exposure to relatively high temperature. Another object is to provide a UV cured coating with good heat stability and non-yellowing characteristics. These and other objects are provided by a photocurable composition comprising a polythiol, a photoinitiator and a polyene of the formula:

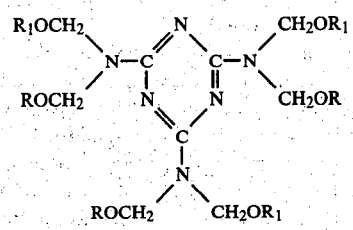

wherein R are all the same member of the group consisting

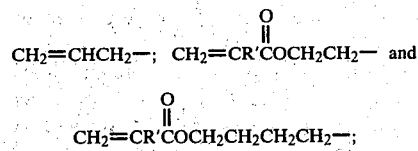

$R_1$ is $-CH_3$ or R, and R' is $-CH_3$ or H.

The polyenes per se and their method of synthesis are old in the art. See for example Helv Chim Acta 24, 318 E, (1941), A. Gams, G. Widmer and W. Fisch which shows a transesterification method of making the allylic terminated polyene and U.S. Pat. No. 3,020,255 which teaches a transesterification method of making the acrylic terminated polyene.

In carrying out these transesterification reactions in the manner described, complete exchange of the alkoxy groups is not achieved and is, in fact, not necessary for the preparation of the polymers of this invention. Thus, a degree of reaction wherein at least three to nearly six unsaturated alkoxy groups per triazine nucleus is sufficient for the preparation of the non-yellowing photopolymeric coating materials described herein.

Polythiol as used herein refers to simple or complex organic compounds having a multiplicity of pendant or terminally positioned —SH functional groups per average molecule.

On the average the polythiol must contain 2 or more —SH groups/molecule and have a viscosity range of essentially 0 to 20 million centipoises (cps) at 70° C. as measured by a Brookfield Viscometer either alone or when in the presence of an inert solvent, aqueous dispersion or plasticizer. Operable polythiols in the instant invention usually have molecular weights in the range about 94 to about 20,000, and preferably from about 100 to about 10,000.

The polythiols operable in the instant invention may be exemplified by the general formula $R_8$(—SH)$_n$ where n is at least 2 and $R_8$ is a polyvalent organic moiety. Thus $R_8$ may contain cyclic groupings and hetero atoms such as N, P or O and primarily contains carbon-carbon, carbon-hydrogen, carbon-oxygen, or silicon-oxygen containing chain linkages.

One class of polythiols operable with polyenes to obtain essentially odorless polythioether products are esters of thiol-containing acids of the formula HS—$R_9$—COOH where $R_9$ is an organic moiety with polyhydroxy compounds of structure $R_{10}$(—OH)$_n$ where $R_{10}$ is an organic moiety and n is 2 or greater. These components will react under suitable conditions to give a polythiol having the general structure:

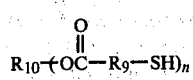

where $R_9$ and $R_{10}$ are organic moieties and n is 2 or greater.

Certain polythiols such as the aliphatic monomeric polythiols (ethane dithiol, hexamethylene dithiol, decamethylene dithiol, tolylene-2,4-dithiol, etc. and some polymeric polythiols such as a thiol-terminated ethylcyclohexyl dimercaptan polymer, etc. and similar polythiols which are conveniently and ordinarily synthesized on a commercial basis, although having obnoxious odors, are operable in this invention but many of the end products are not widely accepted from a practical, commercial point of view. Examples of the polythiol compounds preferred for this invention because of their relatively low odor level include but are not limited to esters of thiogylcolic acid (HS—$CH_2$COOH), α-mercaptopropionic acid (HS—CH($CH_3$)—COOH and β-mercaptopropionic acid (HS—$CH_2CH_2$COOH) with polyhydroxy compounds such as glycols, triols, tetraols, pentaols, hexaols, etc. Specific examples of the preferred polythiols include but are not limited to ethylene glycol bis (thioglycolate), ethylene glycol bis (β-mercaptopropionate), trimethylolpropane tris (thioglycolate), trimethylolpropane tris (β-mercaptopropionate), pentaerythritol tetrakis (thioglycolate) and pentaerythritol tetrakis (β-mercaptopropionate), all of which are commercially available. A specific example of a preferred polymeric polythiol is polypropylene ether glycol bis (β-mercaptopropionate) which is prepared from polypropylene-ether glycol (e.g. Pluracol P2010, Wyandotte Chemical Corp.) and β-mercaptopropionic acid by esterification.

The preferred polythiol compounds are characterized by a low level of mercaptan-like odor initially, and after reaction, give essentially odorless polythioether end products which are commercially attractive and practically useful resins or elastomers for both indoor and outdoor applications.

Prior to curing, the photocurable polymer may be formulated for use as 100% solids, or disposed in organic solvents, or as solutions, dispersions or emulsions in aqueous media.

The photocurable polymer compositions prior to curing may readily be pumped, poured, siphoned, brushed, sprayed, doctored, or otherwise handled as desired. Following application, curing in place to a solid resin or elastomer may be effected either very rapidly or extremely slowly as desired by manipulation of the compounding ingredients and the method of curing.

To obtain the maximum strength, solvent resistance, creep resistance, heat resistance and freedom from tackiness, the reactive components consisting of the polyenes and polythiols are formulated in such a manner as to give solid, crosslinked, three dimensional network polythioether polymer systems on curing. In order to achieve such infinite network formation, the individual polyenes and polythiols must each have a functionality of at least 2 and the sum of the functionalities of the polyene and polythiol components must always be greater than 4. Blends and mixtures of various polyenes and various polythiols containing said functionality are also operable herein.

Functionality as used herein refers to the average number of one or thiol groups per molecule in the polyene or polythiol, respectively. For example, a triene is a polyene with an average of three reactive carbon to carbon unsaturated groups per molecule, and thus has a functionality (f) of three. A dithiol is a polythiol with an average of two thiol groups per molecule and thus has a functionality (f) of two.

The term reactive unsaturated carbon to carbon groups means groups which will react under proper conditions as set forth herein with thiol groups to yield the thioether linkage

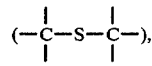

as contrasted to the term unreactive carbon to carbon unsaturation which means

groups found in aromatic nuclei (cyclic structures exemplified by benzene, pyridine, anthracene, and the like) which do not under the same conditions react with thiols to give thioether linkages. For purposes of brevity, this term will hereinafter be referred to generally as reactive unsaturation or a reactive unsaturated compound.

As used herein, the term polyvalent means having a valence of two or greater.

Prior to curing, the polyene and polythiol components are admixed in a suitable manner so as to form a homogeneous curable mixture. Thus, the polyene and polythiol reactants can be admixed without the necessity of using a solvent at room temperature or slightly elevated temperatures up to about 80° C. or, if desired, the reactants may be dissolved in a suitable solvent and, thereafter, the solvent can be removed by suitable means such as evaporation.

The compositions to be cured in accord with the present invention may, if desired, include such additives as antioxidants, accelerators, dyes, inhibitors, activators, fillers, thickeners, pigments, anti-static agents, flame-retardant agents, surface-active agents, extending oils, plasticizers, thixotropic agents and the like within the scope of this invention. Such additives are usually pre-blended with the polyene or polythiol prior to or during the compounding step. The aforesaid additives may be present in quantities up to 500 or more parts based on 100 parts by weight of the polyene-polythiol curable compositions and preferably 0.005-300 parts on the same basis.

The polythioether-forming components and compositions, prior to curing, may be admixed with or blended with reactive diluents, other monomeric and polymeric materials such as thermoplastic resins, elastomers or thermosetting resin monomeric or polymeric compositions.

Non-limiting reactive diluents operable herein include ethylene glycol diacrylate, ethylene glycol dimethacrylate, diethylene glycol diacrylate, diethylene glycol dimethacrylate, trimethylol propane triacrylate, trimethylol propane trimethacrylate, pentaerythritol tetracrylate, pentaerythritol tetramethacrylate, 1,6-hexanediol diacrylate, 1,6-hexanediol dimethacrylate, pentaerythritol triacrylate, neopentyl glycol diacrylate and mixtures thereof. The resulting blend may be subjected to conditions for curing or co-curing of the various components of the blend to give cured products having unusual physical properties.

Although the mechanism of the curing reaction is not completely understood, it appears most likely that the curing reaction may be initiated by most any free radical generating source which dissociates or abstracts a hydrogen atom from an SH group, or accomplishes the equivalent thereof. Generally, the rate of the curing reaction may be increased by increasing the temperature of the composition at the time of initiation of cure. In most applications, however, the curing is accomplished conveniently and economically by operating at ordinary room temperature conditions.

Operable curing initiators or accelerators include radiation such as actinic radiation, e.g., ultraviolet light, lasers; ionizing radiation such as gamma radiation, x-rays, corona discharge, etc.; as well as chemical free radical generating compounds such as azo compounds, peroxides, benzopinacol compounds, etc., which decompose and initiate curing on heating.

Azo or peroxidic compounds (with or without amine accelerators) which decompose on heating are operable as free radical generating agents capable of accelerating the curing reaction including benzoyl peroxide, di-t-butyl peroxide, cyclohexanone peroxide with dimethyl aniline or cobalt naphthenate as an accelerator; hydroperoxides such as hydrogen peroxide, cumene hydroperoxide, t-butyl hydroperoxides; peracid compounds such as t-butylperbenzoate, peracetic acid; persulfates, e.g., ammonium persulfate; azo compounds such as azobis isobutyronitrile; and substituted or unsubstituted pinacol such as benzopinacol.

These free radical generating agents are usually added in amounts ranging from about 0.001 to 10 percent by weight of the curable solid polyene-polythiol composition, preferably 0.01 to 5 percent.

In order to retard or preclude premature curing of the polyene-polythiol formulations, a conventional stabilizer package is admixed into the formulation. Such a stabilizer package includes free radical scavengers, inhibitors or retarders including, but not limited to, combinations of aromatic hydroxy compounds such as hydroquinone and pyrogallol; hindered phenols such as 2,6-di-t-butyl-4-methylphenol and octadecyl 3-(3',5'-di-t-butyl-4-hydroxylphenyl propionate; citric acid, phosphorous acid, phosphoric acid and their esters; and aromatic amines such as phenothiazine and N-phenyl-2-naphthylamine. These stabilizers are added in minor amounts with the total amount of stabilizers in combination being present in the range 0.001 to 5.0 percent by weight of the polyene-polythiol composition.

The preferred free radical generator for the curing reaction is radiation.

The curing reaction can be initiated by radiation having an energy greater than 3 electron volts, i.e., either U.V. radiation or high energy ionizing radiation. The U.V. radiation can be obtained from sunlight or special light sources which emit significant amounts of U.V. light having a wavelength in the range of about 2,000 to about 4,000 Angstrom units. Any type of U.V. light from any source may be used in carrying out the method of this invention. For liquid photocurable compositions, it is preferred that the light emanate from a point source or in the form of parallel rays, but divergent beams are also operable as a source of radiation.

Various light sources may be used to obtain sufficient U.V. radiation to practice the method of this invention. Such sources include carbon arcs, mercury arcs, fluorescent lamps with special ultraviolet light emitting phosphors, xenon arcs, sunlight, tungsten halide lamps, argon glow lamps, photographic flood lamps, lasers and the like.

When U.V. radiation is used for curing, a photoinitiator is added to the composition to increase the curing rate.

Various photoinitiators are operable and well known to those skilled in the art. Examples of photoinitiators include, but are not limited to, benzophenone o-methoxybenzophenone, acetophenone, o-methoxyacetophenone, acenaphthenequinone, methyl ethyl ketone, valerophenone, hexanophenone, γ-phenylbutyrohphenone, p-morpholinopropiophenone, dibenzosuberone, 4-morpholinobenzophenone, benzoin, benzoin methyl ether, 4'-morpholinodeoxybenzoin, p-diacetylbenzene, 4-aminobenzophenone, 4'-methoxyacetophenone, benzaldehyde, o-methoxybenzaldehyde, α-tetralone, 9-acetylphenanthrene, 2-acetylphenanthrene, 10-thioxanthenone, 3-acetylphenanthrene, 3-acetylindole, 9-fluorenone, 1-indanone, 1,3,5-triacetylbenzene, thioxanthen-9-one, xanthene-9-one, 7-H-benz[de]anthracen-7-one, 1-naphthaldehyde, benzoin tetrahydropyranyl ether, 4,4'-bis(dimethylamino)benzophenone, fluorene-9-one, 1'-acetonaphthone, 2'-acetonaphthone, triphenylphosphine, tri-o-tolylphosphine, acetonaphthone and 2,3-butanedione, benz[a]anthracene 7,12 dione, 2,2-dimethoxy-2-phenylacetone, diethoxyacetophenone, dibutoxyacetophenone, etc., which serve to give greatly reduced exposure times and thereby, when used in conjunction with various forms of energetic radiation, yield very rapid, commercially practical time cycles by the practice of the instant invention.

These photoinitiators may range from about 0.005 to 50 percent by weight of the photocurable polyenepolythiol composition, preferably 0.05 to 25 percent.

The mole ratio of the ene/thiol groups for preparing the curable composition is from about 0.2/1.0 to about 8/1.0, and preferably from 0.5/1.0 to about 2/1.0 group ratio.

The radiation curable compositions of the instant invention can also be cured by high energy ionizing irradiation. A preferred feature of the ionizing irradiation operation of the instant invention is treatment with high energy particle irradiation or by gamma-rays or X-rays. Irradiation employing particles in the instant invention includes the use of positive ions (e.g., protons, alpha particles and deuterons), electrons or neutrons. The charged particles may be accelerated to high speeds by means of various voltage gradient mechanisms such as a Van de Graaff generator, a cyclotron, a Cockroft Walton accelerator, a resonant cavity a accelerator, a betatron, a G. E. resonant transformer, a synchroton or the like. Furthermore, particle irradiation may also be supplied from radioactive isotopes or an atomic pile. Gamma rays or X-rays may be obtained from radioisotopes (e.g., cobalt 60) or by particle bombardment of suitable target material (e.g., high energy electrons on a gold metal target).

The dose rate for the irradiation operable to cure the coating in the instant invention is in the range 0.00001 to 1,000 megarads/second.

The amount of ionizing radiation which is employed in curing the radiation curable material in the instant invention can vary between broad limits. Radiation dosages of less than a megarad up to 10 megarads or more for electrons are operable, preferably 0.02 to 5 megarads energy absorbed are employed. For gamma-rays or X-rays, radiation dosages in the range 0.0001 to 5.0 megarads energy absorbed are operable. The irradiation step is ordinarily performed under ambient temperature conditions but can be performed at temperatures ranging from below room temperature up to temperatures of 90° C.

When using ionizing radiation, the depth of penetration is dependent upon the density of the material to be penetrated. If such penetration is not sufficient to cure the coating to the entire depth desired when beaming the radiation from one direction only, one may use multiple radiation sources beaming simultaneously or intermittently from diametrically opposite sides of the coating. Furthermore, shielding can also be employed to increase penetration of the coating on the opposite side away from the radiation source.

The curable polyene and polythiol compositions are used in preparing solid, cured crosslinked insoluble polythioether polymeric products having many and varied uses, examples of which include, but are not limited to, coatings; adhesives; films; molded articles; imaged surfaces, e.g., photoresists; printing plates; e.g., offset, lithographic, letterpress, gravures, etc., silverless photographic materials and the like.

Since the cured materials formed from the polyenepolythiol composition possess various desirable properties such as resistance to severe chemical and physical environments and have good high temperature properties, they are particularly useful for preparing coatings which are non-yellowing even after a high temperature baking.

A general method for preparing coatings, comprises coating the curable composition on a solid surface of a substrate such as plastic, rubber, glass, ceramic, metal, paper and the like and exposing directly to radiation, e.g., UV light until the curable composition cures and crosslinks in the exposed area. The resulting products are cured coatings on suitable substrates or supports.

It is to be understood, however, that when energy sources, e.g., ionizing radiation, other than visible or ultraviolet light, are used to initiate the curing reaction, photoinitiators are not required in the formulation.

When UV radiation is used, an intensity of 0.0004 to 60.0 watts/cm$^2$ in the 240–400 nanometer region is usually employed.

The following examples are set out to explain, but expressly not limit, the instant invention. Unless otherwise noted, all parts and percentages are by weight.

PREPARATION OF THE POLYENE:

EXAMPLE 1

100 g of commercially available hexamethoxymethylmelamine were mixed with 500 g of allyl alcohol in a 3-necked, 3-liter flask equipped with stirrer, thermometer and still head. 3 ml of concentrated HCl was added to the flask and the contents were heated externally by means of a heating mantle at 60° C. for 3½ hours. A vacuum was applied through the still head and controlled to maintain a temperature of about 60° C. in the flask. The mixture was cooled to room temperature and the acid neutralized by the addition with stirring of 10 g of NaHCO$_3$. 200 ml of ethylene dichloride was then added to the flask and the solution was washed three times with water (200 ml each). The product was then isolated by vacuum-stripping of solvent an excess allyl alcohol. The resultant product predominantly of the formula:

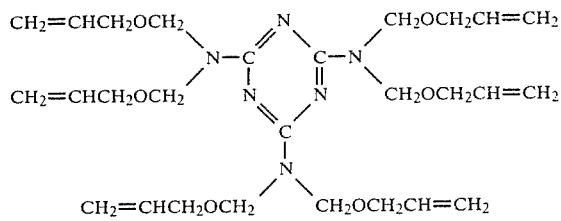

showed 5.7 allyloxy groups per melamine moiety. The product will hereinafter be referred to as Polyene A.

EXAMPLE 2

A photocurable formulation was made up from the following ingredients:
205 g of Polyene A from Example 1
296 g of pentaerythritol tetrakis (β-mercaptopropionate) commercially available from Cincinnati Milacron Inc. under the tradename "Mercaptate Q-43"
2.5 g of benzoin tetrahydropyranyl ether
0.20 g of stabilizer package The photosensitizer and stabilizers were dissolved in the polythiol with warming; then the solution was mixed with the polyene. This formulation will be referred to as Formulation A.

A 0.2 mil thickness of Formulation A was rollercoated onto a white base coated, cold rolled steel plate having a thickness of 22 mils. The plate with the photocurable coating was passed at 100 ft per minute through a Radiant Products UV curing oven containing 3 UV lamps whose major spectral lines were all in the range 2,500 to 4,000 Angstroms. The thus cured coating was then placed in an oven at 450° F. for 15 minutes to test for high temperature yellowing or discoloration of the cured coating. Upon removal from the oven no yellowing or discoloration was visible.

For comparison with other UV curable polyene/polythiol coating compositions, the following series of polyene/polythiol compositions were formulated, cured and baked under the same conditions.

PREPARATION OF POLYENES:

EXAMPLE 3

600 g of commercially available isophorone diisocyanate were charged to a 2 liter resin kettle equipped with stirrer, thermometer, nitrogen blanket and addition funnel. 547.4 g of trimethylolpropane diallyl ether were added slowly via the addition funnel during which time the reaction was allowed to exotherm to 60° C. After the addition the reaction was stirred for 8 hours. 157 g of allyl alcohol was added by means of the addition funnel along with 0.58 g of stannous octoate catalyst and the temperature of the reaction was maintained at 60°–65° C. The reaction was continued with stirring at 60°–65° C. until the NCO content analyzed O by IR. The thus formed allyl-terminated polyene of the formula:

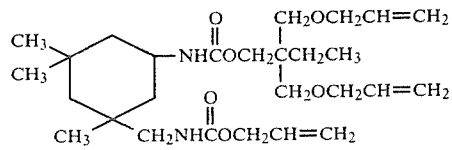

analyzed 5.91 mmoles C=C per g and will be referred to hereinafter as Polyene B.

EXAMPLE 4

To a 25 gallon stainless steel reactor 73.0 pounds of commercially available trimethylolpropane diallyl ether, 22.6 pounds of commercially available allyl alcohol and 8 g of stannous octoate catalyst was charged. The reactor was heated to 130°–140° F. under a nitrogen atmosphere. 67.9 pounds of commercially available toluene diisocyanate was added to the reactor at a rate of approximately 1 pound per minute so that the exotherm temperature does not exceed 150° F. After the addition was complete, 8 g of stannous octoate was added to the reactor and the reaction temperature was maintained at 140°–150° F. with stirring for 2 hours. An additional 8 g of stannous octoate and 16.4 pounds of trimethylolpropane diallyl ether was added to the reactor at a rate to maintain the reactor temperature between 140° and 150° F. The reaction was continued until the NCO content was essentially O. The thus formed polyene of the formula:

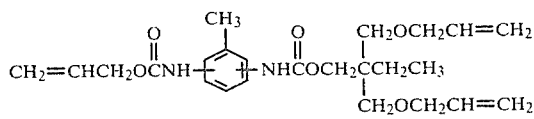

will hereinafter be referred to as Polyene C.

EXAMPLE 5

10 moles of commercially available toluene diisocyanate were charged to a resin kettle equipped with a condenser, stirrer, thermometer and gas inlet and outlet. 20 moles of diallyl ether of trimethylolpropane was slowly added to the kettle. After the addition was complete, 40 g of dibutyl tin dilaurate as a catalyst was added to the kettle and the reaction was continued for 5 hours at 70° C. under nitrogen. The thus formed allyl-terminated liquid prepolymer of the formula:

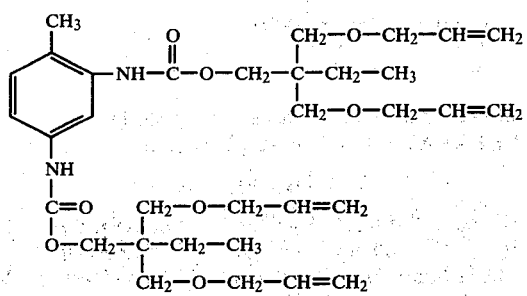

will hereinafter be referred to as Polyene D.

EXAMPLE 6

To a 3,000 ml resin kettle equipped with stirrer, thermometer, nitrogen inlet and outlet and vented addition funnel was charged under a nitrogen blanket 959.4 g of commercially available trimethylolpropane diallyl ether and 0.98 g of stannous octoate catalyst. 1,000 g of commercially available isophorone diisocyanate was charged to the addition funnel and added dropwise to the kettle with stirring over a 4½ hour period while maintaining the temperature below 70° C. After the isophorone diisocyanate was completely added, the temperature was allowed to drop to room temperature (24° C.), the nitrogen blanket discontinued and the reaction was stirred for 48 hours.

To a separate 1,000 ml resin kettle equipped with stirrer, thermometer, nitrogen inlet and outlet and vented addition funnel was charged 597 g of the reaction product from above along with 16 drops of stannous octoate. 138 g of commercially available N,N'-bis(2-hydroxyethyl)dimethylhydantoin was charged to the addition funnel and, thereafter, added dropwise to the resin kettle with stirring while maintaining the temperature below 70° C. The resultant polyene product of the formula:

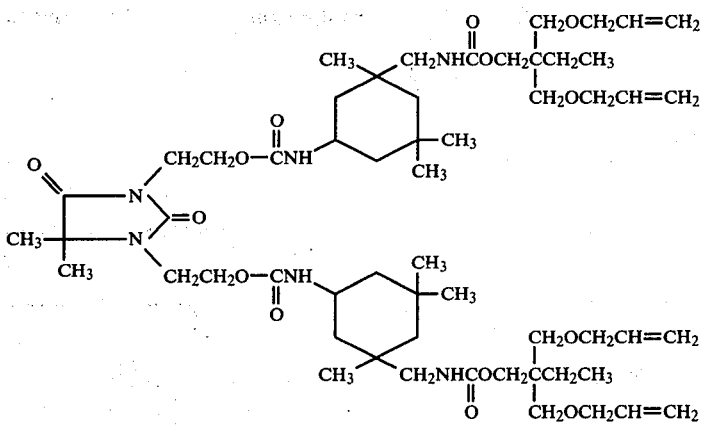

had a glass melting point 95° C., unsaturation: theory, 3.66 mmoles/g; found, 3.78 mmoles/g. This polyene prepolymer will hereinafter be referred to as Polyene E.

EXAMPLE 7

To a 4-necked, 1 liter round bottom flask equipped with stirrer, addition funnel, thermometer, Dean-Stark trap and reflux condenser was charged under a nitrogen blanket 16.0 g of N,N'-bis(2-carboxyethyl)-dimethylhydantoin, 1.30 g of p-toluene sulfonic acid as catalyst and 100 ml of benzene. The mixture was refluxed until the Dean-Stark trap was full of benzene, and then 3.50 g of allyl alcohol and 12.91 g of trimethylolpropane diallyl ether were slowly added via the addition funnel. When no more water was azeotroping into the Dean-Stark trap, the heat was turned off and the product was worked up by washing it twice with 150 ml of water, then twice with 100 ml of 5% aq. NaHCO3, and then again twice with 100 ml of water. The benzene layer containing the product was then dried with anhydrous MgSO4, treated with decolorizing carbon, and then distilled under vacuum until all the benzene was taken off. The polyene product, i.e.,

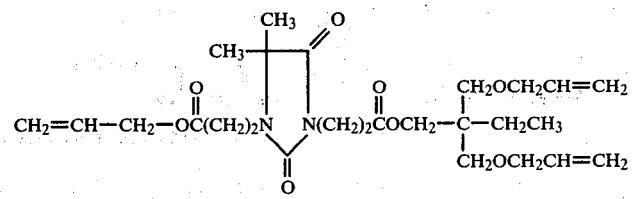

had a C=C content of 5.80 mmoles/g and will be referred to hereinafter as Polyene F.

EXAMPLE 8

253 g of commercially available trimethylol propane diallyl ether (4.54 meq. OH/g) was added dropwise to a 3-necked flask containing 200 g of toluene diisocyanate (an 80/20 mixture of the 2,4 and 2,6 isomers) (11.48 meq. NCO/g). The reaction was continued with stirring at 60° C. for 8 hours. To the reaction product was added 118 g of commercially available di(2-hydroxyethyl)-dimethylhydantoin (8.92 meq. OH/g) of the formula:

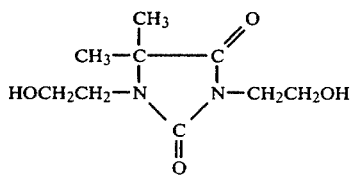

along with 0.25 g of stannous octoate as a catalyst. Some heat was required to start the reaction and, due to the mixture becoming extremely viscous as the reaction proceeds, the temperature had to be raised to 95° C. to insure proper mixing. The reaction was maintained at this temperature until complete as shown by the disappearance of the NCO band by IR. The resulting product of the formula:

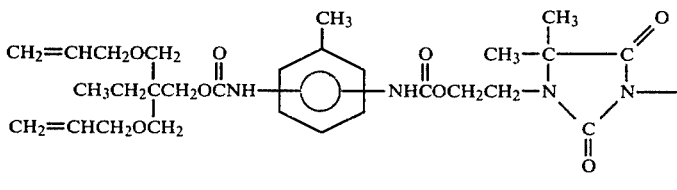
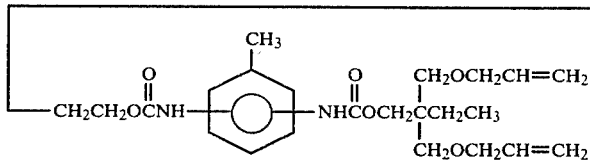

had a glass melting point of 95° C., unsaturation: theory, 4.03 mmoles/g; found, 4.06 mmoles/g. This polyene prepolymer will hereinafter be referred to as Polyene G.

EXAMPLE 9

42 lbs of commercially available toluene diisocyanate was charged to a 30 gallon glass reactor together with 15.0 g of stannous octoate. 163 g of triphenyl phosphite was then added followed by 31.4 lbs of hydroxypropyl acrylate at such a rate that the temperature did not exceed 60° C. A second addition of stannous octoate (17.0 g) was then made followed by 133 lbs of polypropylene glycol having a molecular weight of about 1,000 and commercially available from Union Carbide under the tradename "PPG-1025".

The reaction mixture was heated at 60° C. until no unreacted isocyanate could be detected by IR. The thus formed acrylate-terminated polyene of the formula:

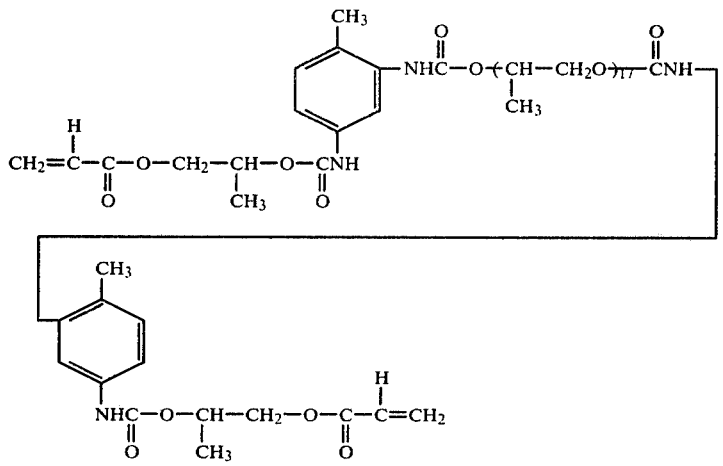

will hereafter be referred to as Polyene H.

PREPARATION OF POLYTHIOLS

EXAMPLE 10

To a 2,000 ml 3-necked flask equipped for distillation with stirrer and nitrogen inlet was charged 432 g (2 moles) of commercially available N,N'-bis(2-hydroxyethyl)dimethylhydantoin, 445 g of mercaptopropionic acid and 17.5 g p-toluene sulfonic acid. 100 ml of ethylene dichloride was added to the flask. The mixture was heated with stirring for 8 hours and the evolved water was continuously removed by azeotropic distillation at 71°-75° C., returning the ethylene dichloride to the reaction flask. The solution in the flask was then washed once with about 1,000 ml water, twice with about 1,000 ml of 5 percent sodium bicarbonate and finally with about 1,000 ml of water. The solution was dried over anhydrous magnesium sulfate, mixed with 10 g of decolorizing carbon and filtered. The solvent was removed by vacuum distillation, affording 672 g of product or an 86 percent yield ot the following polythiol:

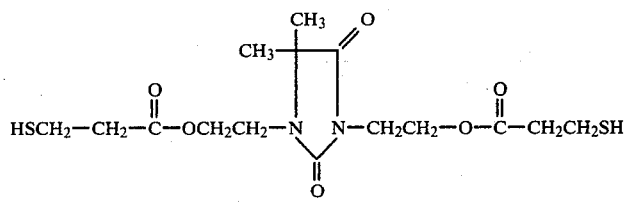

This polythiol will be referred to hereinafter as Polythiol A.

EXAMPLE 11

1 mole of tris(2-hydroxyethyl)isocyanurate, 4.5 moles of 3-mercapto-propionic acid and 100 milliliters toluene are charged to a 1 liter 3-neck round bottom flask equipped with stirrer, heating mantle, thermometer and condenser Dean Stark trap. The reaction was carried out for 7 hours at a temperature of about 130° C. during which time water was continuously removed in the Dean Stark trap. The extent of the reaction was calculated either from the amount of water removed or by titrating the acid value. The reaction mixture was poured into a separatory funnel and water was added. Washing with water was continued until the pH of the wash water was neutral. The toluene layer containing the product was filtered through magnesium sulfate and, thereafter, the toluene was stripped off at 70° C. under a reduced pressure of 20 mm in a rotating evaporator. The yield of the tris(3-mercaptopropionate) ester of tris(2-hydroxyethyl)isocyanurate, i.e.,

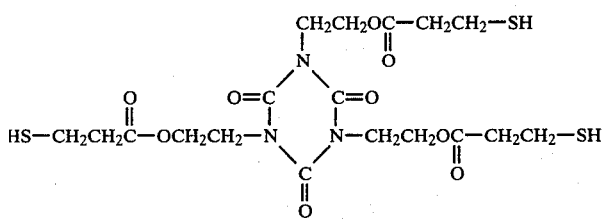

was in excess of 90% and will be referred to hereinafter as Polythiol B.

EXAMPLE 12

Using the above prepared polyenes and polythiols in addition to other similar commercially available materials, the following UV curable formulations were made up for comparative yellowing tests after high temperature baking.

FORMULATION B:

| Components | Parts by Weight |
|---|---|
| Polyene B from Example 3 | 283.5 |
| Trimethylolpropane tris(mercaptopropionate) commercially available from Cincinnati Milacron Inc. under the tradename "Mercaptate P-33" | 108.25 |
| Ethylene glycol bis(mercaptopropionate) | 108.25 |
| Diallyl maleate | 47.6 |
| Benzophenone | 8.7 |
| Stabilizer package | 3.16 |

FORMULATION C:

| Components | Parts by Weight |
|---|---|
| Polyene C from Example 4 | 45.7 |
| "Mercaptate P-33" polythiol | 20.6 |
| Ethylene glycol bis(mercaptopropionate) | 19.2 |
| Diallyl maleate | 9.3 |
| Diethoxyacetophenone | 2.7 |
| Benzophenone | 1.74 |
| Stabilizer package | 0.63 |

FORMULATION D:

| Components | Parts by Weight |
|---|---|
| Polyene C from Example 4 | 38.85 |
| Polyene E from Example 6 | 6.74 |
| "Mercaptate P-33" | 20.67 |
| Ethylene glycol bis(mercaptopropionate) | 16.32 |
| Diallyl maleate | 7.94 |
| Benzophenone | 6.48 |
| Diethoxyactophenone | 2.45 |
| Stabilizer package | 0.62 |

FORMULATION E:

| Components | Parts by Weight |
|---|---|
| Polyene C from Example 4 | 52.0 |
| "Mercaptate P-33" polythiol | 22.96 |
| Ethylene glycol bis(mercaptopropionate) | 21.9 |
| Benzoin isobutyl ether | 1.9 |
| Diethoxyacetophenone | 0.09 |
| Stabilizer package | 0.46 |

FORMULATION F:

| Components | Parts by Weight |
|---|---|
| Trimethylolpropane diallyl ether | 1770.0 |
| "Mercaptate P-33" | 2230.0 |
| Benzophenone | 80.0 |
| Stabilizer package | 12.0 |

FORMULATION G:

| Components | Parts by Weight |
|---|---|
| Trimethylolpropane diallyl ether Pentaerythritol tetrakis | 462.0 |

| Components | Parts by Weight |
|---|---|
| (β-mercaptopropionate), commercially available from Cincinnati Milacron Inc. under the tradename "Mercaptate Q-43" | 538.0 |
| Benzophenone | 20.0 |
| Stabilizer package | 3.1 |

FORMULATION H:

| Components | Parts by Weight |
|---|---|
| Trimethylolpropane triacrylate | 408.1 |
| Triallyl cyanurate | 1368.0 |
| "Mercaptate P-33" polythiol | 72.0 |
| Stabilizer package | 1.2 |

FORMULATION I:

| Components | Parts by Weight |
|---|---|
| Triallyl cyanurate | 66.07 |
| Polythiol A from Example 10 | 69.15 |
| "Mercaptate P-33" | 60.80 |
| Benzophenone | 3.85 |
| Stabilizer package | 0.133 |

FORMULATION J:

| Components | Parts by Weight |
|---|---|
| Triallyl cyanurate | 31.51 |
| Polythiol A from Example 10 | 50.06 |
| "Mercaptate P-33" | 15.92 |
| Benzophenone | 1.95 |
| Stabilizer package | 0.56 |

FORMULATION K:

| Components | Parts by Weight |
|---|---|
| Polyene D from Example 5 | 183.7 |
| "Mercaptate P-33" | 302.0 |
| "Mercaptate Q-43" | 69.0 |
| Trimethylolpropane triacrylate | 215.0 |
| Triallyl cyanurate | 135.0 |
| 1,6-hexanediol diacrylate | 27.5 |
| Benzophenone | 33.4 |
| Stabilizer package | 14.74 |

FORMULATION L:

| Components | Parts by Weight |
|---|---|
| Polyene E from Example 6 | 731.25 |
| Polythiol A from Example 10 | 547.5 |
| Benzophenone | 25.58 |
| Stabilizer package | 4.48 |

FORMULATION M:

| Components | Parts by Weight |
|---|---|
| Diallyl itaconate | 250.0 |
| Polythiol B from Example 11 | 520.72 |
| Polythiol A from Example 10 | 106.03 |
| Benzoin isopropyl ether | 17.53 |
| Stabilizer package | 26.74 |

FORMULATION N:

| Components | Parts by Weight |
|---|---|
| Polyene F from Example 7 | 250.0 |
| Diallyl isophthalate | 29.79 |
| Polythiol B from Example 11 | 295.8 |
| Benzoin isopropyl ether | 11.51 |
| Stabilizer package | 17.44 |

FORMULATION O:

| Components | Parts by Weight |
|---|---|
| Diallyl maleate | 300.0 |
| Polythiol B from Example 11 | 468.65 |
| Polythiol A from Example 10 | 95.43 |
| Benzoin isopropyl ether | 17.28 |
| Stabilizer package | 26.18 |

FORMULATION P:

| Components | Parts by Weight |
|---|---|
| Polyene H from Example 9 | 651.3 |
| Diethylene glycol diacrylate | 521.1 |
| Vinyl acetate | 117.5 |
| "Mercaptate P-33" | 117.5 |
| Benzophenone | 70.8 |
| Methyldiethanolamine | 14.1 |
| Stabilizer package | 8.1 |

FORMULATION Q:

| Components | Parts by Weight |
|---|---|
| Diallyl maleate | 150.0 |
| Polythiol B from Example 11 | 275.0 |
| 2,2-dimethoxy-2-phenylacetophenone | 12.77 |
| Stabilizer package | 12.90 |

FORMULATION R:

| Components | Parts by Weight |
|---|---|
| Diallyl maleate | 150.0 |
| "Mercaptate Q-43" | 191.0 |
| Benzoin isopropyl ether | 10.23 |
| Stabilizer package | 10.33 |

FORMULATION S:

| Components | Parts by Weight |
|---|---|
| Polyene G from Example 8 | 395.5 |
| Trimethyolpropane diallyl ether | 231.0 |
| Ethylene glycol bis(β-mercaptopropionate) | 201.5 |
| "Mercaptate Q-43" | 269.0 |
| Benzophenone | 21.94 |
| Stabilizer package | 3.63 |

The above formulations were made up by dissolving the photosensitizers and stabilizers in the polythiol with warming followed by mixing this solution with the polyene.

A 0.2 mil thickness of each formulation was roller-coated onto a white base coated, cold-rolled steelplate having a thickness of 22 mils. The thus coated plate was then passed at 100 ft per minute through a Radiant Products UV curing oven containing three UV lamps whose major spectral lines were all in the range 2,500 to 4,000 Angstroms. Following curing the plates were placed in an oven at 450° F. for 15 minutes. Upon removal from the oven the plates were cooled to room temperature in air and then a visual observation was made to detect yellowing. The coatings were rated from 0 (no yellowing to 5 (a complete dark yellow color) with a rating of 0 or 1 being commercially acceptable. The results are shown in TABLE I.

TABLE I

| Formulation | Yellowing Scale Rating | Remarks |
|---|---|---|
| A | 0 | |
| B | 5 | |
| C | 5 | |
| D | 5 | |
| E | 5 | |
| F | 3+ | |
| G | 3+ | Fair cure only |
| H | 4+ | |
| I | 4 | |
| J | 4 | |
| K | 4 | |
| L | 3 | Poor cure |
| M | 5 | Skim cure |
| N | 5 | |
| O | 5 | |
| P | 5 | |
| Q | 2 | Poor wetting |
| R | 2 | Poor wetting |
| S | 5 | |

The following examples show the operability of Polyene A with various polythiols to obtain a non-yellowing coating after high temperature baking.

EXAMPLE 13

The following formulations were made up from the ingredients as listed below:
- 100 g of Polyene A from Example 1;
- 145 g of "Mercaptate P-33";
- 1.2 g of benzophenone;
- 0.9 g of stabilizer package;
this will be referred to as Formulation T.
- 100 g of Polyene A from Example 1;
- 186.7 g of Polythiol B from Example 11;
- 1.43 g of benzophenone;
- 0.11 g of stabilizer package;
this will be referred to as Formulation U.

The above formulations were made up by dissolving the photosensitizers and stabilizers in the polythiol with warming followed by mixing this solution with polyenes.

A 0.2 mil thickness of each formulation was roller-coated onto a white based coated, cold-rolled steelplate having a thickness of 22 mils. The thus coated plate was then passed at 100 ft per minute through a Radiant Products UV curing oven containing three UV lamps whose major spectral lines were all in the range 2,500 to 4,000 Angstroms. Following curing the plates were placed in an oven at 450° F. for 15 minutes. Upon removal from the oven the plates were cooled to room temperature in air and then a visual observation was made to detect yellowing. The coatings were rated from 0 (no yellowing) to 5 (a complete dark yellow color). The coating of Formulation T was rated 1 on a scale of 0 (no yellowing) to 5 (a complete dark yellow color). Formulation U was rated 1— on the same scale.

The following acrylic terminated derivative of melamine is also operable with a polythiol in a UV curable formulation to form non-yellowing coatings after high temperature baking.

EXAMPLE 14

Hexamethoxymethylmelamine (1200 g), 2-hydroxyethyl acrylate (1072 g), methanesulfonic acid (12.0 g), xylene (420 g) and hydroquninone monomethyl ether (2.3 g) were mixed in a 3-liter, 4-neck flask equipped with thermometer, stirrer, vacuum adapter and an inlet. Two traps, one cooled with ice and the next with dry ice, were connected in series with the vacuum outlet. The mixture was heated to 65° C.; then vacuum was applied in such a manner as to maintain the temperature of the reaction mixture at 65° C. After 3 hours the reaction was interrupted and 2.3 g of 2,6-di-t-butyl-4-methylphenol was added. The reaction was continued with stirring under about 29" of Hg vacuum for about 3 hours. The toluene-free polyene product, predominantly of the formula:

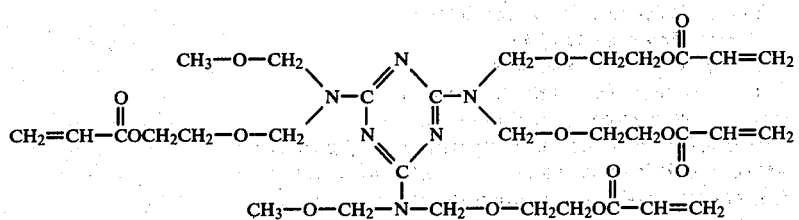

will hereinafter be referred to as Polyene I.

EXAMPLE 15

A photocurable formulation was made up from the following ingredients:
- 125 g of Polyene I from Example 14;
- 63 g of "Mercaptate Q-43";
- 0.07 g of stabilizer package;
- 0.38 g of benzophenone;
this will be referred to as Formulation V.

The above formulation was made up by dissolving the photosensitizer and stabilizers in the polythiol with warming followed by mixing this solution with the polyene.

A 0.2 mil thickness of the formulation was roller-coated onto a white base coated, cold-rolled steelplate having a thickness of 22 mils. The thus coated plate was then passed at 100 ft per minute through a Radiant Products UV curing oven containing three UV lamps whose major spectral lines were all in the range 2,500 to 4,000 Angstroms. Following curing the plate was placed in an oven at 450° F. for 15 minutes. Upon removal from the oven the plate was cooled to room temperature in air and then a visual observation was made to detect yellowing. The coating of Formulation V was rated 1+ on a scale of 0 (no yellowing) to 5 (a complete dark yellow color).

EXAMPLE 16

Hexamethoxymethylmelamine (130 g), 1,4-butanediol monoacrylate (240 g), p-toluene sulfonic acid (1.3 g)

and hydroquinone monomethyl ether (0.18 g) were mixed in a liter, 4-neck flask equipped with thermometer, stirrer, vacuum adapter and an inlet. Two traps, one cooled with ice and the next with dry ice, were connected in series with the vacuum outlet. The mixture was heated to 60° C.; then vacuum was applied in such a manner as to maintain the temperature of the reaction mixture at about 65° C. The reaction was continued with stirring under about 29" of Hg vacuum for about 3½ hours. The polyene product, predominantly of the formula:

| Components | Parts by Weight |
|---|---|
| Pentaerythritol tetrakis (β-mercaptopropionate), commercially available | 180.0 |
| Benzophenone | 4.44 |
| Stabilizer package | 0.076 |

The Formulations X and Y were made up by dissolving the photosensitizer and stabilizers in the polythiol with warming at 60° C. Thereafter, a room temperature,

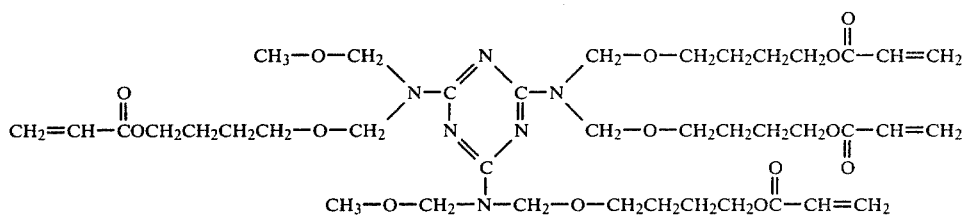

will hereinafter be referred to as Polyene J.

EXAMPLE 17

A photocurable formulation was made up from the following ingredients:
20 g of Polyene J from Example 16;
11.6 of "Mercaptate Q-43";
0.01 g of stabilizer package;
0.32 g of benzoin tetrahydropyranyl ether;
this will be referred to as Formulation W.

The above formulation was made up by dissolving the photosensitizer and stabilizers in the polythiol with warming followed by mixing this solution with the polyene.

A 0.2 mil thickness of the formulation was roller-coated onto a white base coated, cold-rolled steelplate having a thickness of 22 mils. The thus coated plate was then passed at 100 ft per minute through a Radiant Products UV curing oven containing three UV lamps whose major spectral lines were all in the range 2,500 to 4,000 Angstroms. Following curing the plate was placed in an oven at 450° F. for 15 minutes. Upon removal from the oven the plate was cooled to room temperature in air and then a visual observation was made to detect yellowing. The coating of Formulation W was rated 1+ on a scale of 0 (no yellowing) to 5 (a complete dark yellow color).

EXAMPLE 18

The following UV curable formulations were made up for a comparative yellowing test after high temperature baking:

FORMULATION X

| Components | Parts by Weight |
|---|---|
| Triallyl isocyanurate | 96.0 |
| Pentaerythritol tetrakis (β-mercaptopropionate), commercially available | 144.0 |
| Benzoin Tetrahydropyranyl ether | 0.6 |
| Stabilizer package | 0.3 |

FORMULATION Y

| Components | Parts by Weight |
|---|---|
| Polyene D from Example 5 | 200.0 | the polyene was added to the polythiol with stirring. The formulations showed no change in viscosity over a 48 hour period. A 0.2 mil thickness of each formulation was roller-coated onto a white base coated, cold-rolled steelplate having a thickness of 22 mils. The thus coated plates were then passed at 100 ft per minute through a Radiant Products UV curing oven containing three UV lamps whose major spectral lines were all in the range 2,500 to 4,000 Angstroms. Following curing, the plates were placed in an oven at 450° F. for 15 minutes. Upon removal from the oven the plates were cooled to room temperature in air and then a visual observation was made to detect yellowing. The coatings were rated from 0 (no yellowing) to 5 (a complete dark yellow color), with a rating of 0 to 1 being commercially acceptable. The coating of Formulation X was rated 3, and the coating of Formulation Y was rated 4.

I claim:

1. The process of forming a non-yellowing, cured polythioether heat stable at 450° F. for at least 15 minutes which comprises admixing a composition comprising a polythiol, a photoinitiator and a polyene of the formula:

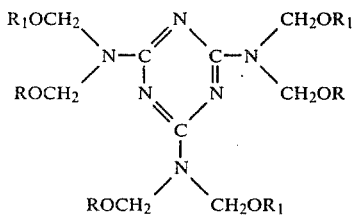

wherein R are all the same member of the group consisting of

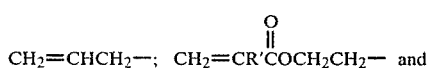

$R_1$ is —$CH_3$ or R, and R' is —$CH_3$ or H and thereafter exposing said composition to UV radiation.

2. The process of forming a non-yellowing coating on a substrate said coating being heat stable at 450° F. for at least 15 minutes which comprises applying to the substrate a layer of a photocurable composition comprising a polythiol, a photoinitiator and a polyene of the formula:

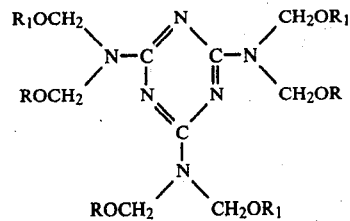

wherein R are all the same member of the group consisting of $$CH_2=CHCH_2-; \quad CH_2=CR'\overset{O}{\underset{\|}{C}}OCH_2CH_2- \text{ and}$$

$$CH_2=CR'\overset{O}{\underset{\|}{C}}OCH_2CH_2CH_2CH_2-;$$

$R_1$ is $-CH_3$ or R, and R' is $-CH_3$ or H and thereafter exposing said composition to UV radiation.

* * * * *